(12) United States Patent
Villa et al.

(10) Patent No.: US 6,518,147 B1
(45) Date of Patent: Feb. 11, 2003

(54) PROCESS FOR MANUFACTURING AN SOI WAFER BY OXIDATION OF BURIED CHANNELS

(75) Inventors: Flavio Francesco Villa, Milan (IT); Gabriele Barlocchi, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 7 days.

(21) Appl. No.: 09/625,112

(22) Filed: Jul. 25, 2000

(30) Foreign Application Priority Data

Jul. 26, 1999 (EP) .............................. 99830477

(51) Int. Cl.[7] .............................................. H01L 21/76
(52) U.S. Cl. ...................... 438/429; 438/405; 438/413; 438/444
(58) Field of Search ................................ 438/429, 404, 438/405, 413, 442, 444

(56) References Cited

U.S. PATENT DOCUMENTS

| | | | |
|---|---|---|---|
| 4,361,600 A | * 11/1982 | Brown | |
| 4,502,913 A | 3/1985 | Lechaton et al. | ........... 156/643 |
| 4,685,198 A | 8/1987 | Kawakita et al. | ............. 437/73 |
| 4,704,186 A | * 11/1987 | Jastrzebski | |
| 4,888,300 A | * 12/1989 | Burton | |
| 5,525,824 A | 6/1996 | Himi et al. | ................. 257/370 |

FOREIGN PATENT DOCUMENTS

| | | |
|---|---|---|
| EP | 0615286 A2 | 9/1994 |
| EP | 0929095 A1 | 7/1999 |
| EP | 1073112 A1 * | 1/2002 |
| JP | 2001-68544 A * | 2/2002 |

* cited by examiner

*Primary Examiner*—John F. Niebling
*Assistant Examiner*—Ron Pompey
(74) *Attorney, Agent, or Firm*—Lisa K. Jorgenson; E. Russell Tarleton; SEED IP Law Group PLLC

(57) ABSTRACT

A process that includes the steps of forming, in a wafer of monocrystalline silicon, first trenches extending between portions of the wafer; etching the substrate to remove the silicon around the first trenches and forming cavities in the substrate; covering the walls of the cavities with an epitaxial growth inhibiting layer; growing a monocrystalline epitaxial layer on top of the substrate and the cavities so as to obtain a monocrystalline wafer embedding buried cavities completely surrounded by silicon; forming second trenches extending in the epitaxial layer as far as the cavities; removing the epitaxial growth inhibiting layer; oxidizing the cavities, forming at least one continuous region of buried oxide; depositing a polysilicon layer on the entire surface of the wafer and inside the second trenches; removing the polysilicon layer on the surface and leaving filling regions inside the second trenches; and oxidizing, on the top, portions of said filling regions so as to form field oxide regions.

23 Claims, 14 Drawing Sheets

Fig. 15
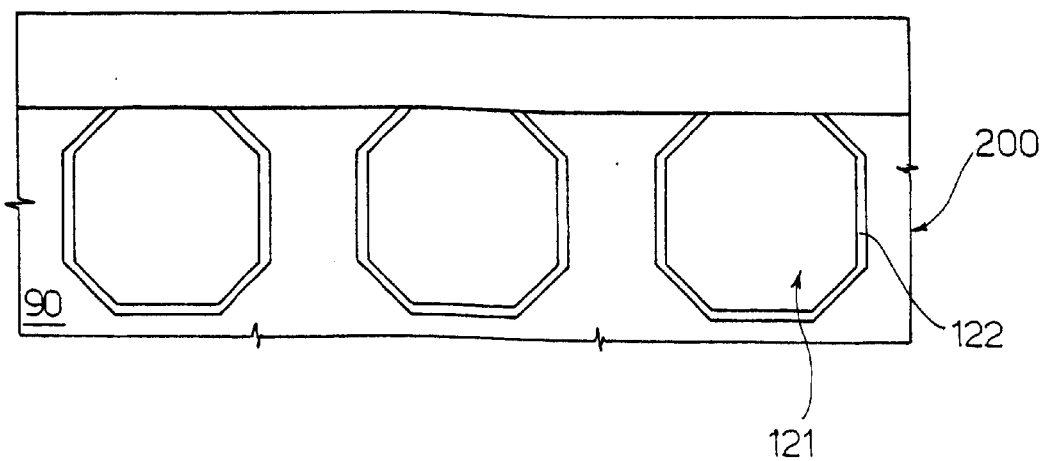
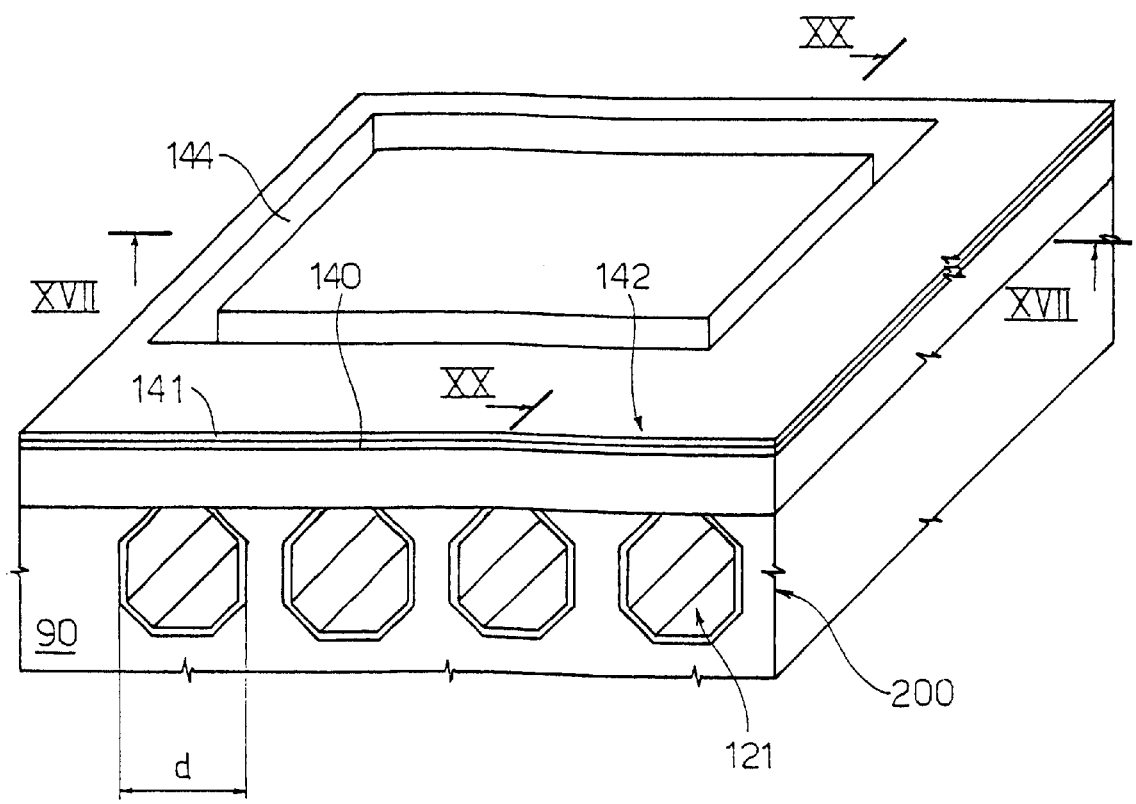
Fig. 16

PROCESS FOR MANUFACTURING AN SOI WAFER BY OXIDATION OF BURIED CHANNELS

TECHNICAL FIELD

The present invention regards a process for manufacturing an SOI wafer by oxidation of buried channels.

BACKGROUND OF THE INVENTION

As is known, according to current processing techniques in the microelectronics industry, the substrate of integrated devices is obtained from monocrystalline silicon wafers. Recently, as an alternative to just silicon wafers, composite wafers have been proposed, so-called "SOI" (Silicon-on-Insulator) wafers comprising two silicon layers, one of which is thinner than the other, separated by a silicon oxide layer.

A process for manufacturing SOI wafers is the subject of European patent application No. 98830007.5, filed on Jan. 13, 1998 in the name of STMicroelectronics S.r.l., and is described hereinafter with reference to FIGS. 1 to 8.

According to this process, on a surface 3 of a substrate 2, a first silicon oxide layer is initially grown having a thickness of between, for example, 20 and 60 nm. A first silicon nitride layer having a thickness of between 90 and 150 nm is then deposited. Using a resist mask, dry etching is carried out on the uncovered portions of the first oxide layer and the first nitride layer, and the resist mask is then removed, providing the intermediate structure of FIG. 1, where the wafer thus obtained is indicated, as a whole, by 1, and the portions of the first oxide layer and of the first nitride layer that have remained after dry etching are indicated by 4 and 5, and define respective first protective regions 7 covering first portions 8' of the substrate 2.

The first protective regions 7 form a hard mask, indicated as a whole by 9, which is used to etch the substrate 2 at second portions 8" left uncovered by the mask 9, so as to form initial trenches 10 (FIG. 2). Subsequently, as shown in FIG. 3, the wafer 1 is subjected to oxidation, to form a second oxide layer 11 which has a thickness of between, for example, 20 and 60 nm and covers the walls and the bottom of the initial trenches 10, and then a second silicon nitride layer 12 is deposited for a thickness of between 90 and 150 nm.

Next, layers 12 and 11 are anisotropically etched without a mask. Given the anisotropy of the etching, the horizontal portions of the second silicon nitride layer 12 and second silicon oxide layer 11 on the bottom of the initial trenches 10, and the portion of the second silicon nitride layer 12 above the portions 4 and 5 are removed, providing the intermediate structure of FIG. 4, wherein the regions 8' are still covered on top by the mask 9 and on the sides (i.e., on the vertical walls of the initial trenches 10) by a silicon oxide portion 11' and by a silicon nitride portion 12'. Instead, the substrate 2 is bare on the bottom 15 of the initial trenches 10.

The uncovered silicon at the bottom 15 of the initial trenches 10 is then etched away, to deepen the initial trenches 10 themselves until final trenches 16 having a desired depth are obtained. In particular, the depth of the final trenches 16 determines the dimensions of the desired buried oxide layer, and hence the electrical characteristics of the SOI wafer, as will be described more clearly hereinafter, and consequently the depth is determined according to the specifications provided for the final SOI wafer.

The substrate 2 now comprises a base portion 2', and a plurality of "columns" 18 which extend vertically from the base portion 2'. The intermediate structure of FIG. 5 is thus obtained, wherein the silicon nitride portions 5 and 12' are no longer distinct from one another and are designated by 19. The silicon oxide portions 4 and 11' are no longer distinct from one another and are designated by 20 and form, together with portions 19, second protective regions 30.

A thermal oxidation step is then carried out, so that the exposed silicon regions of the columns 18 are transformed into silicon oxide. In practice, oxide regions are gradually grown at the expense of the silicon regions, starting from the side walls of the final trenches 16 towards the inside of the columns and partly also towards and within the base portion 2'. Since during oxidation there is an increase in volume, the oxide regions being formed gradually occupy the space of the final trenches 16 until they fill the trenches completely and join up together. The oxidation step terminates automatically once the columns 18 are completely oxidized (except for the top area or tip, designated by 21, which is protected by the second protective regions 30), thus forming a continuous buried oxide region 22, shown in FIG. 6, where the vertical continuous lines indicate the meeting surfaces of the oxide regions being formed from the walls of two adjacent final trenches 16, to highlight the expansion of the oxide.

Subsequently, by selective etching, the second protective regions 30 are eliminated so as to uncover the tips 21, which form the germs for a subsequent epitaxial growth.

The structure of FIG. 7 is obtained, showing the three-dimensional structure of the wafer 1 in this step. Next, an epitaxial growth is performed, the parameters of which are chosen to as to prevent nucleation of the silicon in the areas overlying the buried oxide region 22, and a high ratio of lateral to vertical growth is chosen so as to obtain first a horizontal growth of the silicon around the tips 21 (and thus the coating of the top surface of the buried oxide region 22), and subsequently the vertical growth of an epitaxial layer 23. After an optional step of chemical-mechanical polishing to planarize the top surface of the wafer 1, the final structure of the wafer 1 is then obtained, as shown in FIG. 8.

Thereby, an SOI wafer can be produced using only process steps that are common in microelectronics, with much lower costs than those of processes currently used for forming SOI substrates.

The above described manufacturing process has, however, the drawback that the shape of the buried oxide region 22 is not ideal. In fact, as highlighted in the enlarged detail of FIG. 9, during thermal oxidation, the exposed silicon regions of the columns 18 are oxidized along curved lines, so that the buried oxide region 22 presents, underneath, a shape that is defined by a series of arches 35 and, on top, a shape defined by a series of cusps 37 extending upwards at each wall of the final trenches 16. In addition, between the grown epitaxial silicon layer and the buried oxide layer, a void area 40 is present. This shape of the buried oxide region 22 renders critical the epitaxial growth of the silicon to form the SOI wafer, and, in addition, the void area 40 is a cause of non-optimal electrical characteristics.

SUMMARY OF THE INVENTION

The disclosed embodiments of the present invention overcome the drawbacks of the manufacturing process described above.

According to the disclosed embodiment of the present invention, a process for manufacturing SOI wafers and a SOI wafer are provided. The process includes forming cavities in a substrate of semiconductor material; growing an epitaxial layer of monocrystalline type on top of the substrate and the cavities to obtain a wafer of monocrystalline semiconductor material embedding the cavities, the cavities being completely surrounded by the monocrystalline material; and oxidizing the cavities to form at least one continuous region of buried oxide.

According to another aspect of the disclosed embodiments of the invention, a process for manufacturing an SOI wafer is disclosed that includes: forming first trenches in a substrate of semiconductor material; etching the first trenches to form cavities in the substrate of semiconductor material; growing an epitaxial layer of monocrystalline silicon on top of the substrate of semiconductor material to cover the trenches and the cavities formed therein; forming second trenches in the substrate of semiconductor material to extend as far as the cavities; and oxidizing the cavities to form at least one continuous region of buried oxide.

In accordance with yet another embodiment of the invention, an SOI wafer of semiconductor material is disclosed, which includes a substrate of monocrystalline semiconductor material with at least one semiconductor material region having a monocrystalline structure, and an insulating material layer arranged between the at least one semiconductor material region and the substrate; trenches having walls covered with a dielectric material layer and housing filling portions of the semiconductor material, the trenches delimiting at the sides of the at least one semiconductor material region; and field oxide regions overlying the top of the filling regions.

BRIEF DESCRIPTION OF THE DRAWINGS

For a better understanding of the present invention, a preferred embodiment thereof will now be described, purely as a non-limiting example, with reference to the attached drawings, wherein:

FIGS. 10–15 show cross-sections through a SOI wafer corresponding to a manufacturing process according to an embodiment of the present invention;

FIG. 16 shows a perspective cross-section in a subsequent step according to the embodiment of the present invention;

DETAILED DESCRIPTION OF THE INVENTION

An embodiment of the invention will now be described with reference to FIGS. 10–23.

Figure 10:
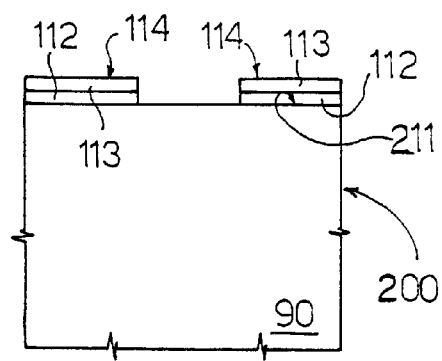
Figure 11:
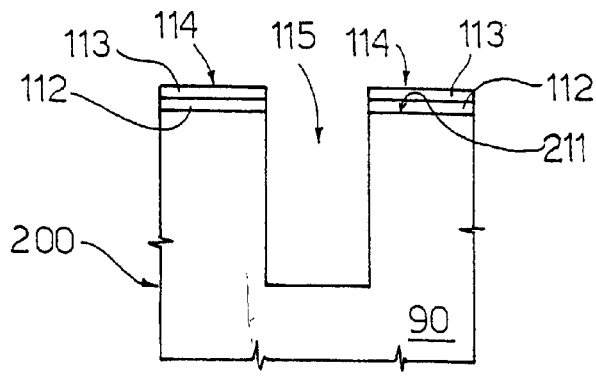
Figure 12:
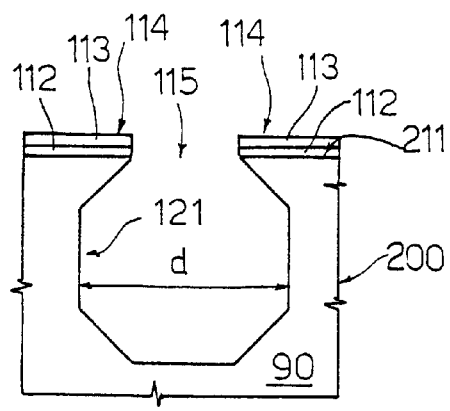
Figure 13:
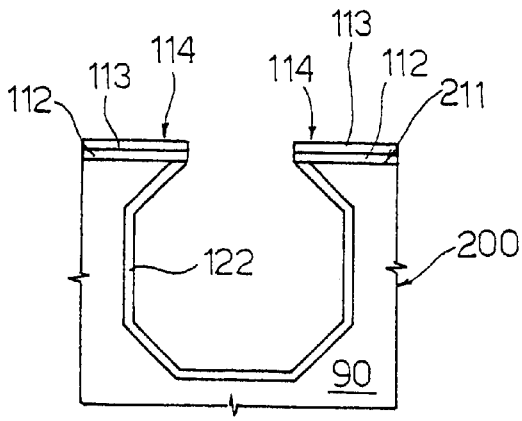
Figure 14:
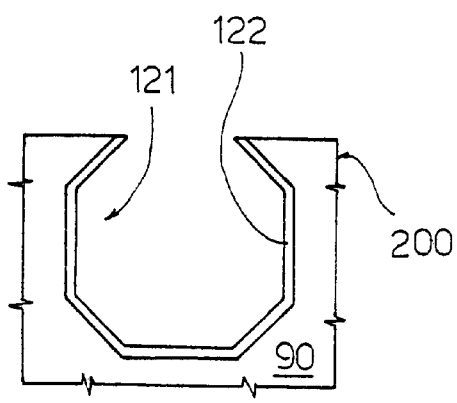
Figure 18:
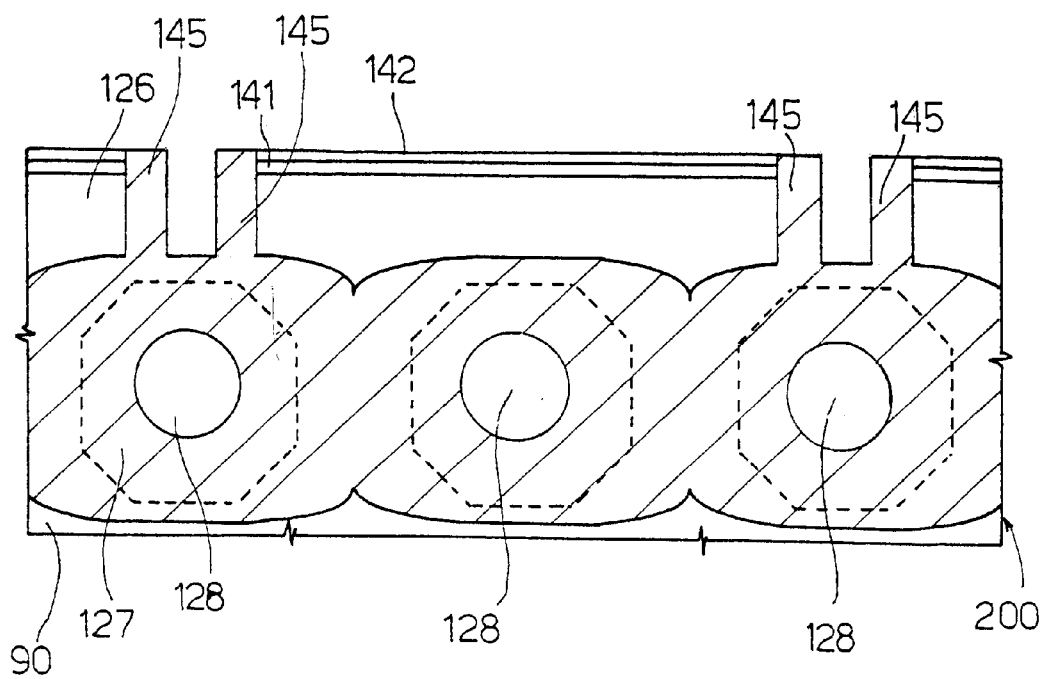
Figure 19:
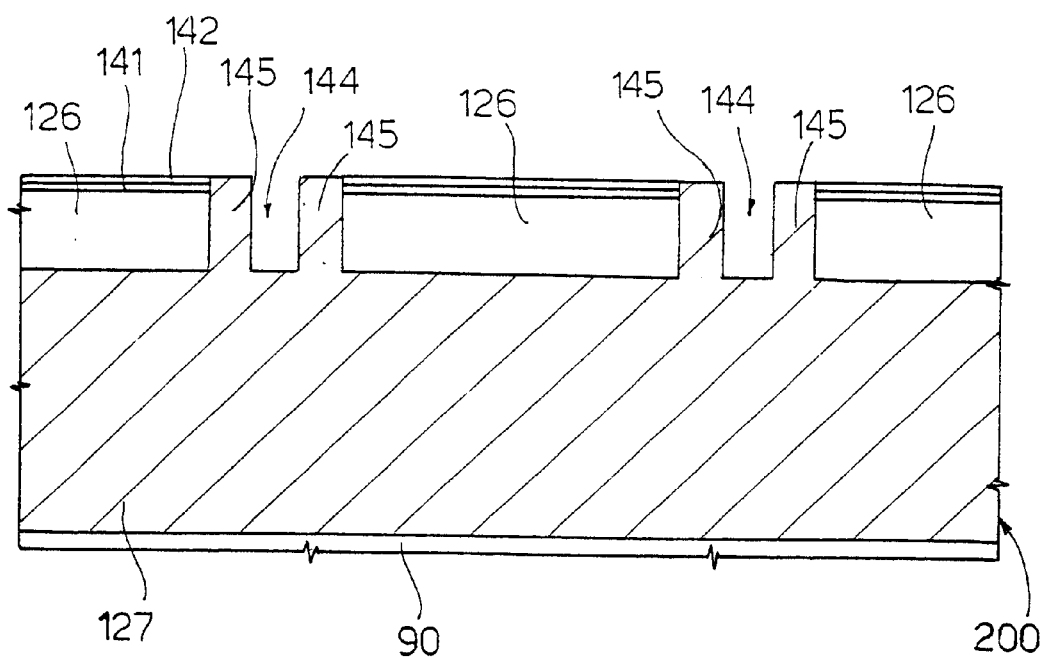
FIGS. 19–22 show cross-sections of the wafer of FIG. 16, taken in a plane XX—XX, in successive steps of the manufacturing process according to the embodiment of the present invention.

According to FIG. 10, on the surface 211 of the wafer 200 of semiconductor material comprising a monocrystalline substrate 90, a first oxide layer having a thickness of, for example, between 20 and 60 nm is grown. A first nitride layer having a thickness of between 90 and 150 nm is then deposited. Using a resist mask, the uncovered portions of the first nitride layer and of the first oxide layer are dry etched, and the resist mask is then removed. In this way, the portions of the first oxide layer and of the first nitride layer that are left after dry etching (oxide portions 112 and nitride portions 113 in FIG. 10) form a hard mask, designated as a whole by 114.

Subsequently, using the hard mask 114, the wafer 200 is anisotropically etched (first trench etch) to form first trenches 115 (FIG. 11) having a width of, for example, between 1 and 3 $\mu$m (preferably, 2 $\mu$m) and a depth depending upon the structures to be made, for example 10–30 $\mu$m.

Next (see FIG. 12), timed etching in TMAH (tetramethyl ammonium hydroxide) of the silicon around the first trenches 115 is carried out. Since this etch is basically of an isotropic type, it enables the formation of cavities 121 having a width d (in the widest point) of, for example, 10–200 $\mu$m and, in any case, much greater than the first trenches 115. Typically, the first trenches 115 have a shape elongated in the direction perpendicular to the plane of the drawing, and the cavities 121 form elongated channels.

According to the orientation and duration of the TMAH etch, it is possible to obtain, in a known way, different geometries of the cavities 121. In particular, in the case of elongated cavities 121 extending lengthwise at 90° with respect to the flat of the wafer, i.e., perpendicular to the sheet of the drawing, the cavities 121 have the shape shown in FIG. 12. In the case of elongated cavities 121 extending lengthwise at 45° to the flat of the wafer, the cavities 121 have the shape of tubs with approximately vertical walls extending from underneath the hard mask 114.

Next (FIG. 13), the walls of the cavities 121 are coated with an inhibiting layer 122, which does not allow epitaxial growth. For this purpose, for example, a fast oxidation step may be performed so as to grow an oxide layer (having a thickness greater than the portions of oxide 112 and nitride 113 which cover the surface 211 of the wafer 200 and the walls of the first trenches 115, as explained later, for instance between 60 and 200 nm); in the alternative, a conform layer of a material chosen from among deposited oxide, nitride, and tetraethyl orthosilicate (TEOS) may be deposited.

Next (FIG. 14), the hard mask 114 is removed from the surface 211 of the wafer 200. During removal of the oxide portion 112 and nitride portion 113, also part of the inhibiting layer 122 is removed; however, since the latter is thicker, it is not removed completely and remains to an extent sufficient to ensure complete covering of the walls of the cavities 121.

Subsequently (FIG. 15), epitaxial growth is carried out, using as germ the monocrystalline silicon of the substrate 90. Consequently, the monocrystalline silicon grows, starting from the surface 211, both vertically and horizontally so as to close the cavities 121. The silicon does not grow, instead, inside the cavities 121, given the presence of the inhibiting layer 122. In this way, a monolithic wafer 200 of monocrystalline silicon (shown in FIG. 15) is obtained, comprising the substrate 90 and an epitaxial layer 126, and housing completely closed cavities 121 internally delimited to a large extent by the inhibiting layer 122.

Figure 17:
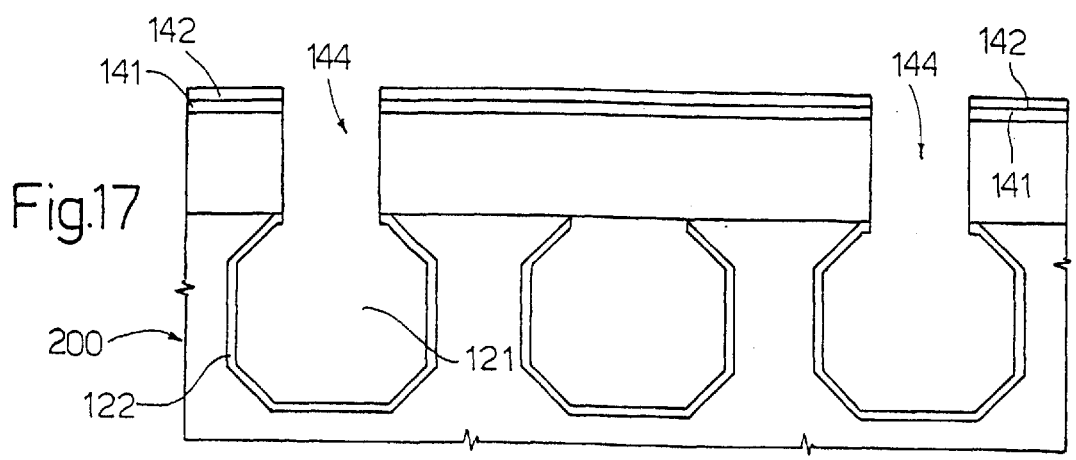
FIGS. 17–18 show cross-sections of the wafer of FIG. 16, taken along the plane XVII—XVII, in subsequent steps of a manufacturing process according to the embodiment of the present invention.

As shown in FIGS. 16 and 17, a trench etch (second trench etch) of the silicon overlying the cavities 121 is then carried out to form second connection trenches, for example having the shape of a closed-path line extending roughly along the external perimeter of the region of the substrate 90 that houses the cavities 121. For this purpose, in a per se known manner, a third oxide layer 140 is initially deposited or grown; then, a third nitride layer 141 (FIG. 16) is deposited. The third oxide layer 140 and third nitride layer 141 are defined photolithographically so as to form a second hard mask 142 which covers the wafer 200 completely, except for the parts of the epitaxial layer 126 that are to be etched. The uncovered silicon is then etched to form second trenches 144, which extend up to the cavities 121.

Subsequently, thermal oxidation is carried out so that the silicon regions exposed around the cavities 121 and on the walls of the second trenches 144 transform into silicon oxide. In practice, there is a gradual growth of the oxide regions at the expense of the silicon regions, starting from the side walls of the cavities 121 and of the trenches 144 towards the inside of the cavities and trenches themselves and in part also outwards. Since during the oxidation there is an increase in volume, the oxide regions being formed gradually occupy the space of the cavities 121 until they close the cavities almost completely and join up together. The oxidation step is completed once the cavities are oxidized (possibly apart from an internal area where a hole, designated by 128, is left), thus forming a continuous buried oxide region 127—shown in FIGS. 18 and 19, which are taken along two perpendicular planes—whereas oxide regions 145 are formed on the side walls of the trenches 144.

Figure 20:
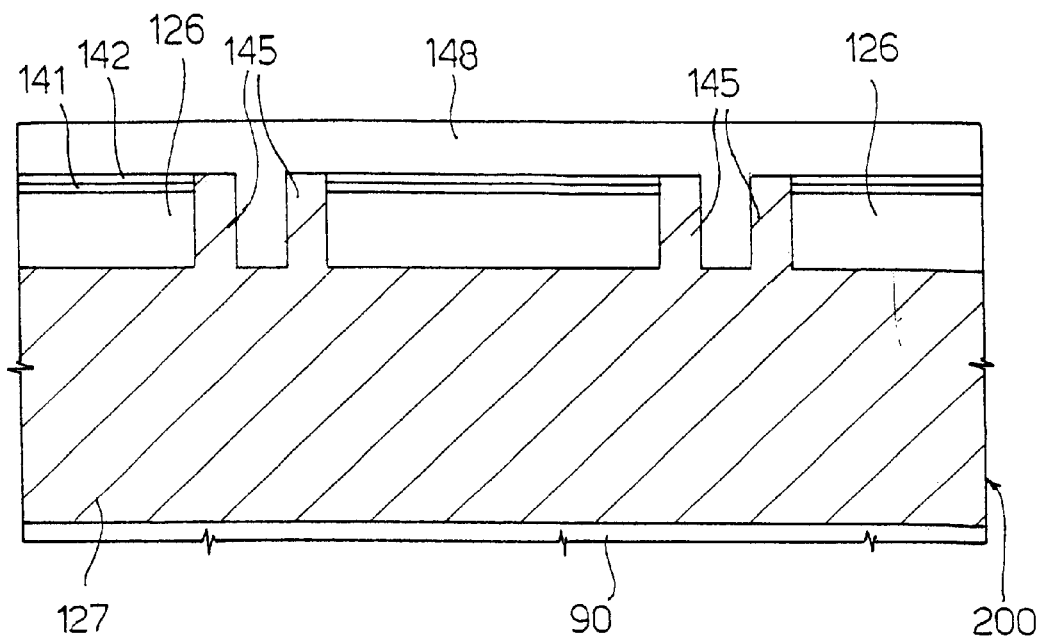

Next, a polysilicon layer 148 is deposited on the surface of the wafer 200 and fills the trenches 144, as shown in FIG. 20.

Figure 21:
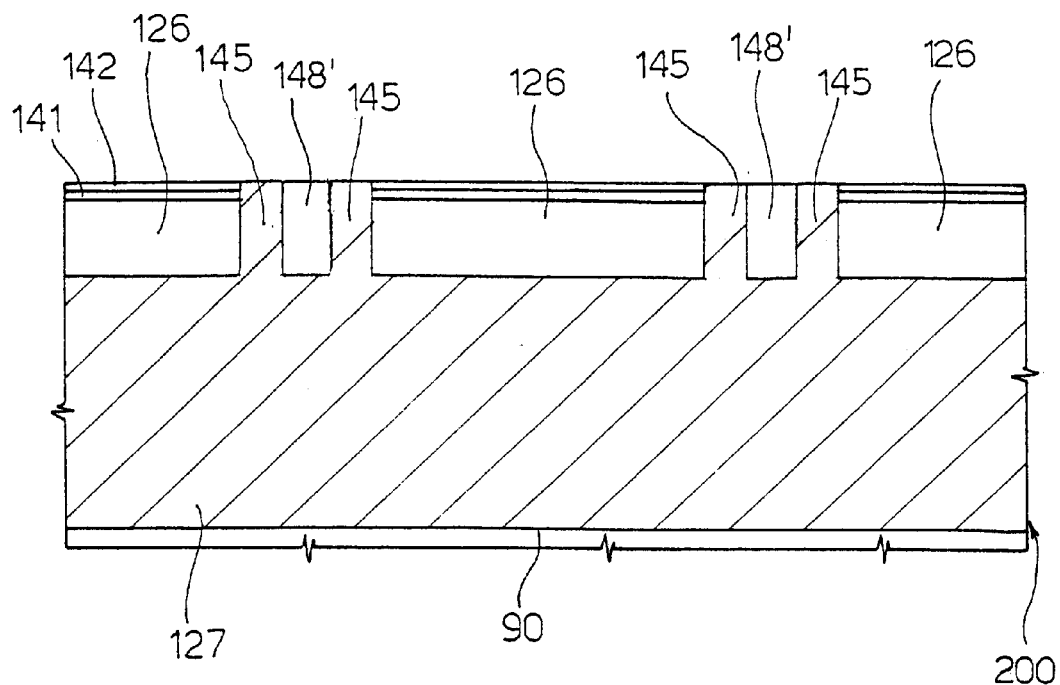

Subsequently, by etching or a mechanical process, the polysilicon layer 148 is removed from the surface of the wafer 200 and remains only inside the trenches 144, where it forms filling regions 148', as shown in FIG. 21.

Figure 22:
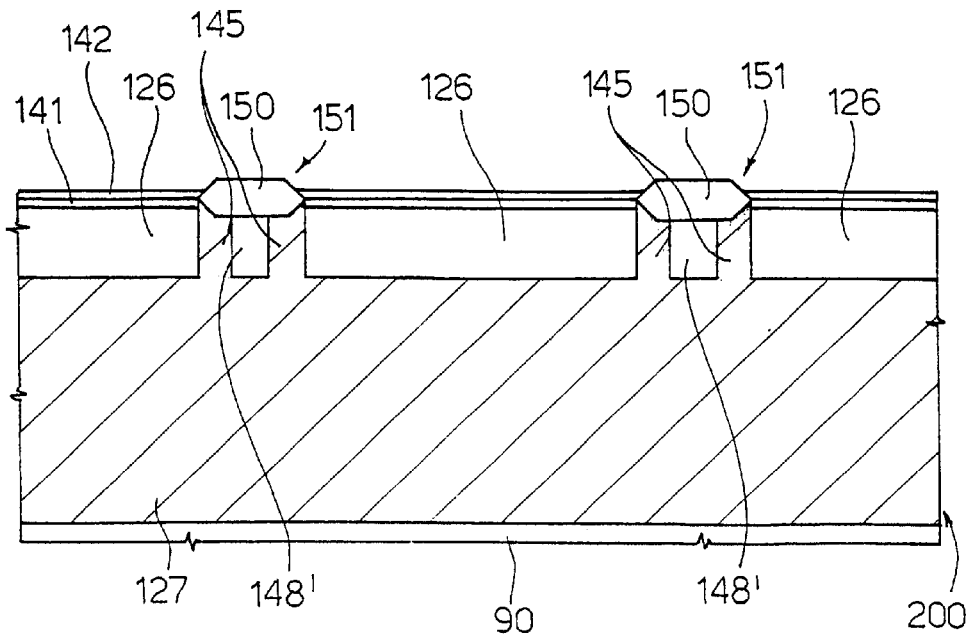

Finally, the upper portions of the filling regions 148' are thermally oxidized so as to form field oxide regions 150 which close the filling regions 148' at the top and in a complete way, forming, together with the oxide regions 145 and the filling regions 148' themselves, insulating regions 151, as shown in FIG. 22.

Figure 1:
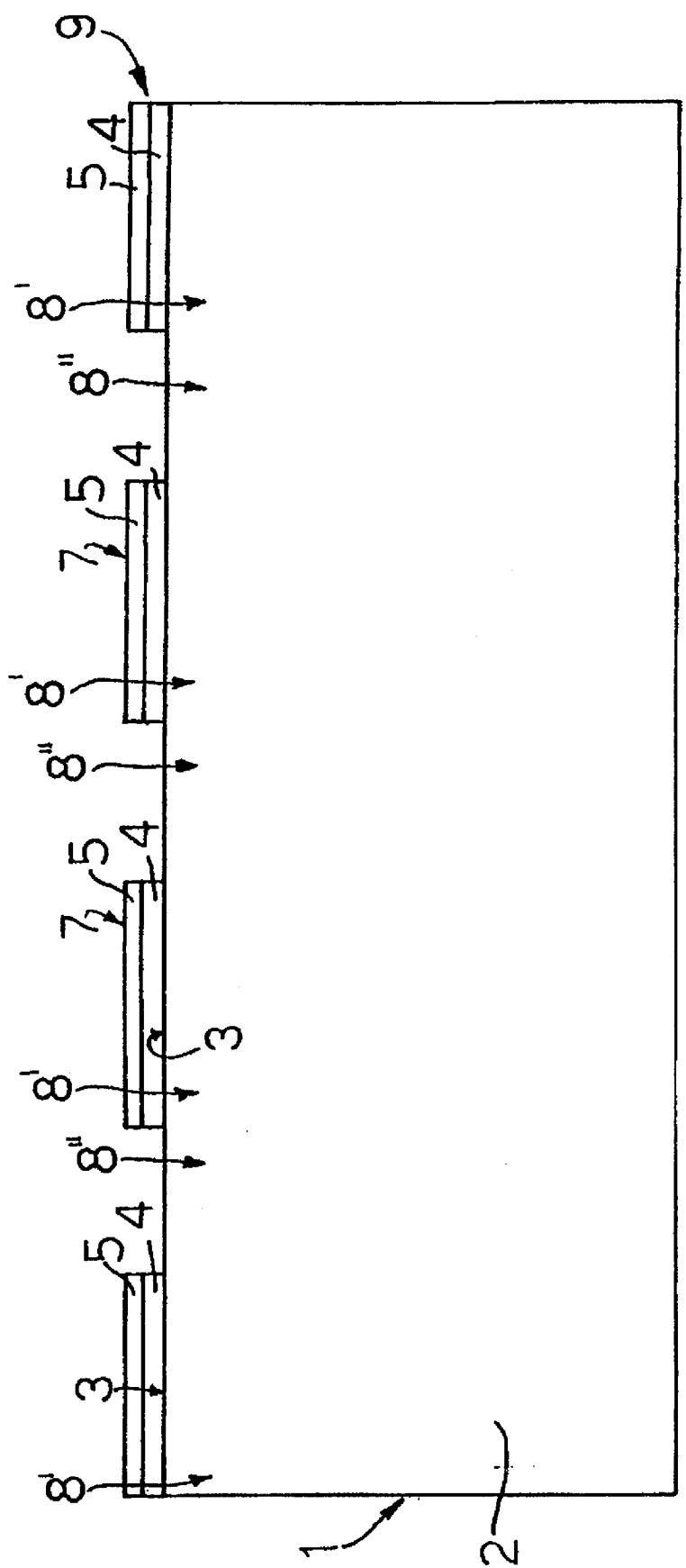
FIGS. 1–6 show cross-sections through a SOI wafer in successive manufacturing steps according to a prior process.
Figure 2:
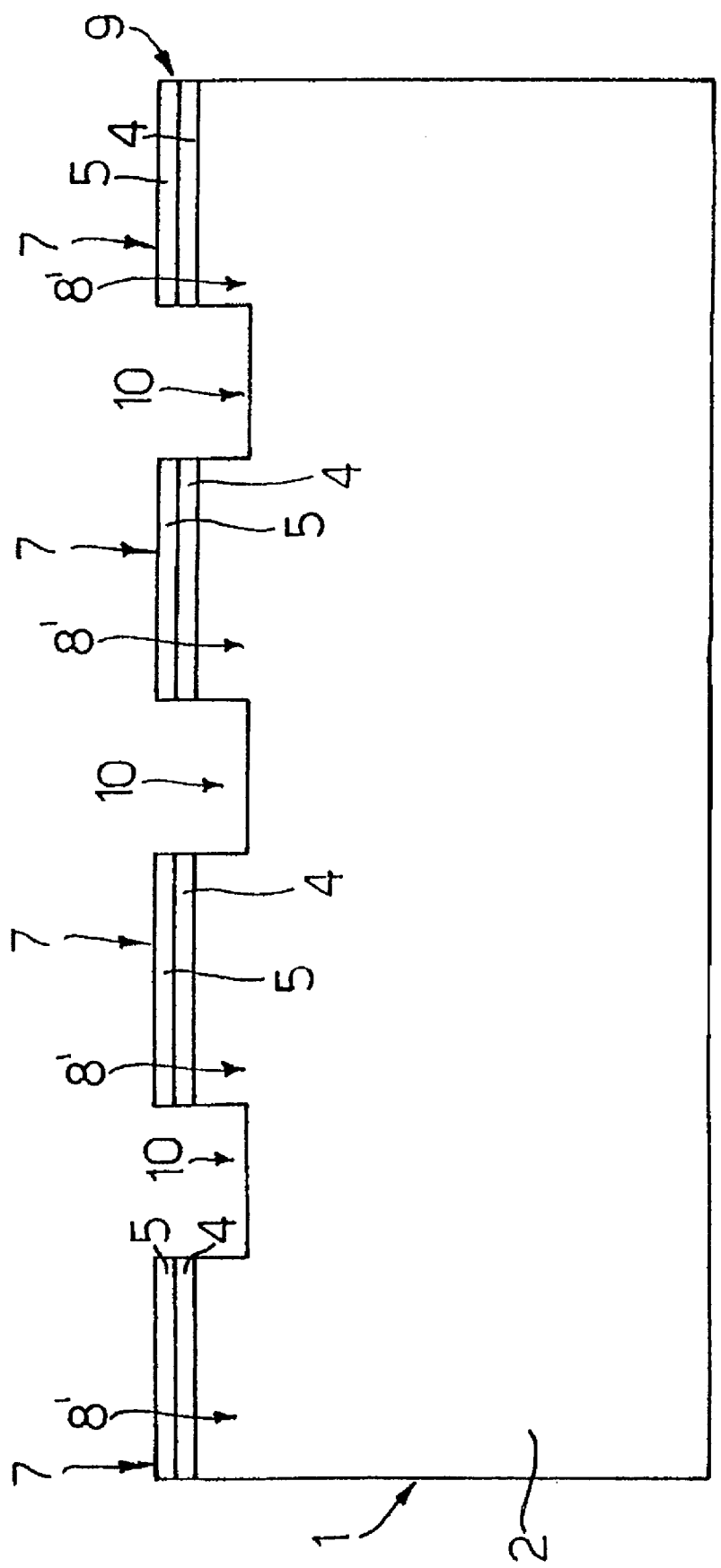
Figure 3:
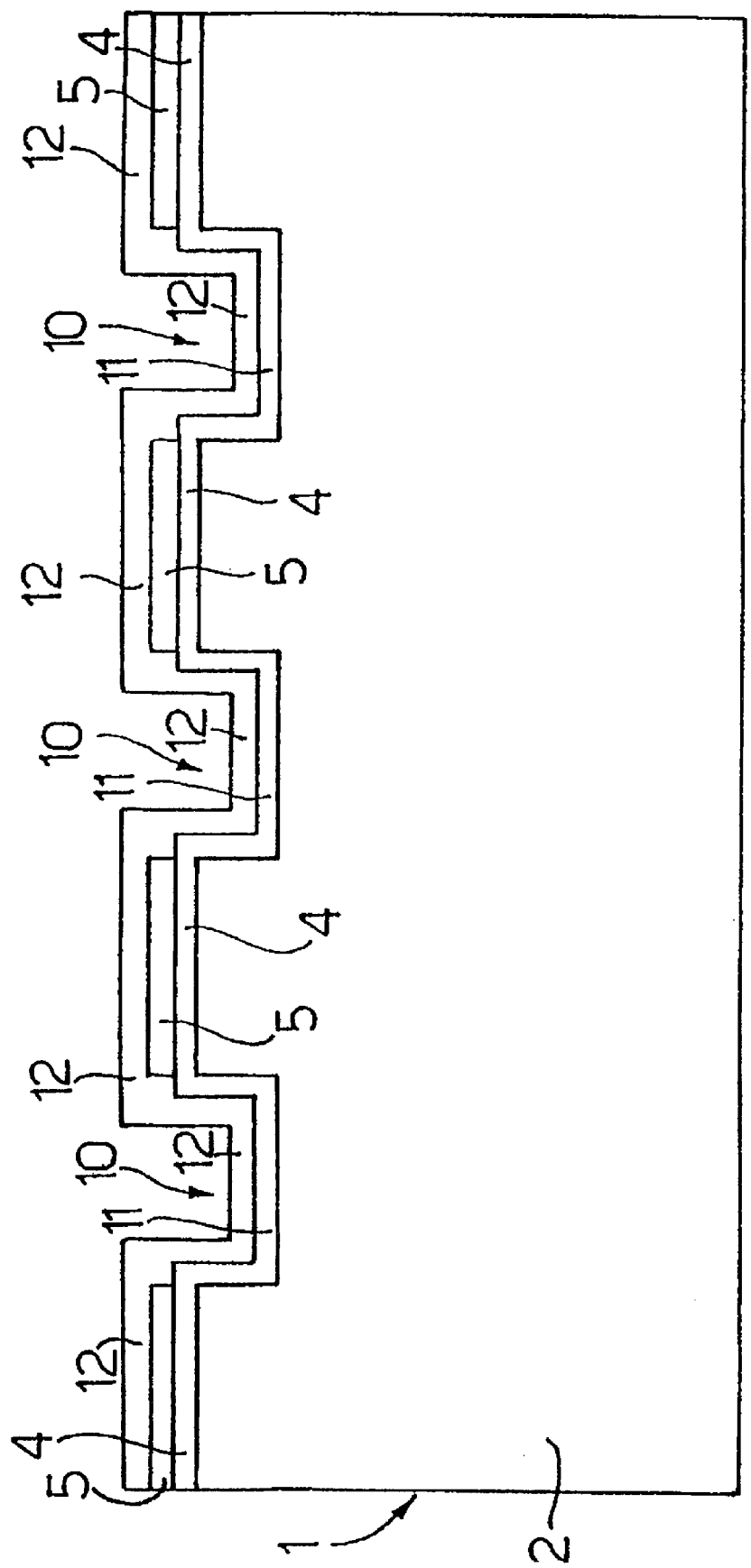
Figure 4:
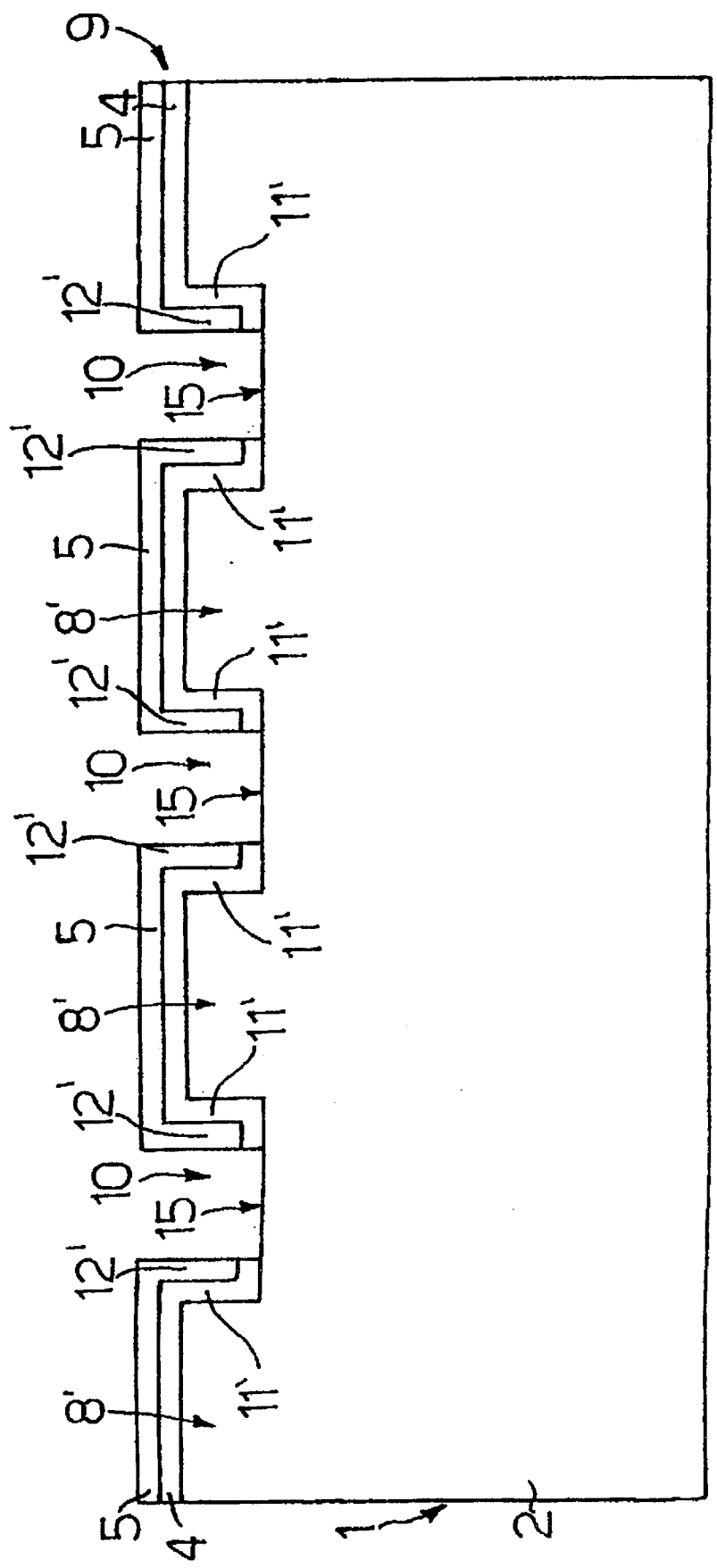
Figure 5:
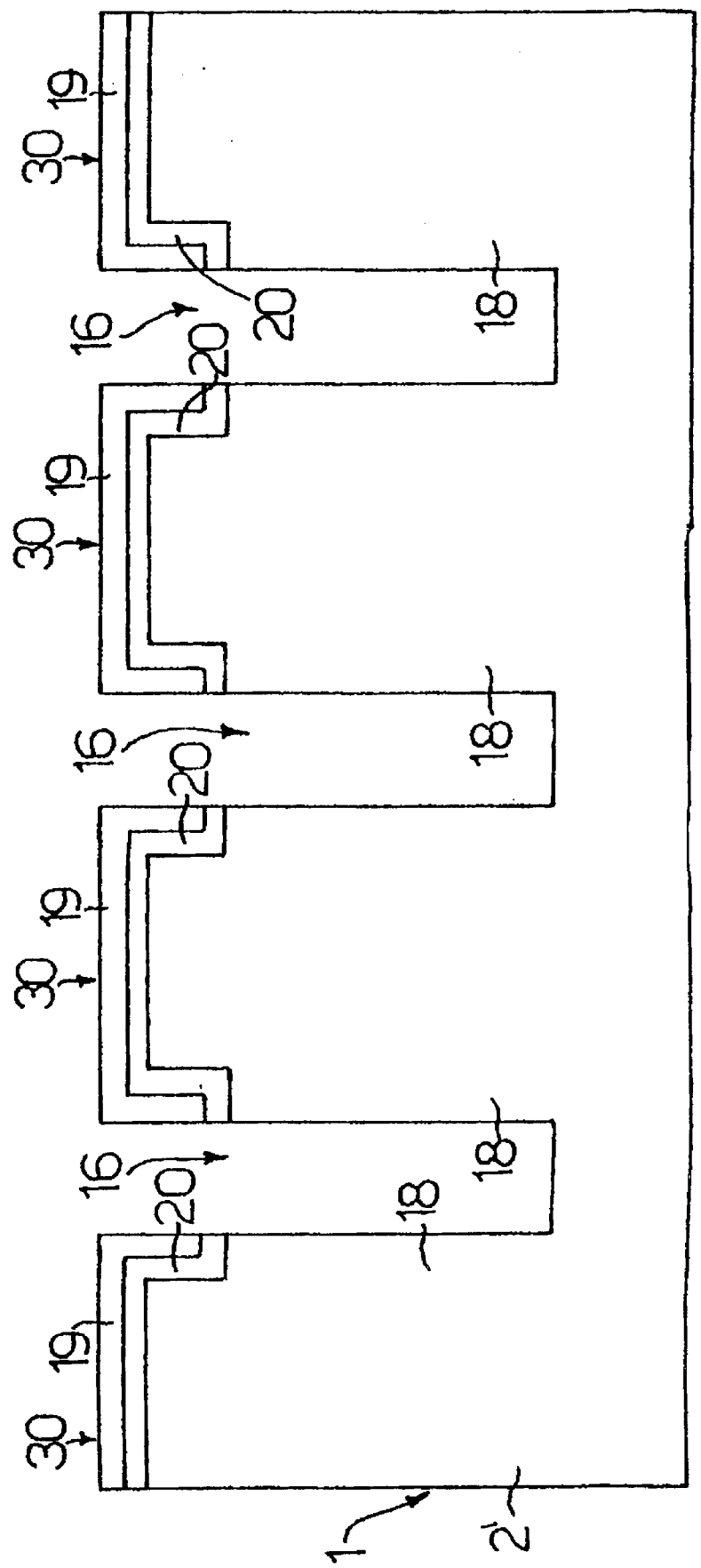
Figure 6:
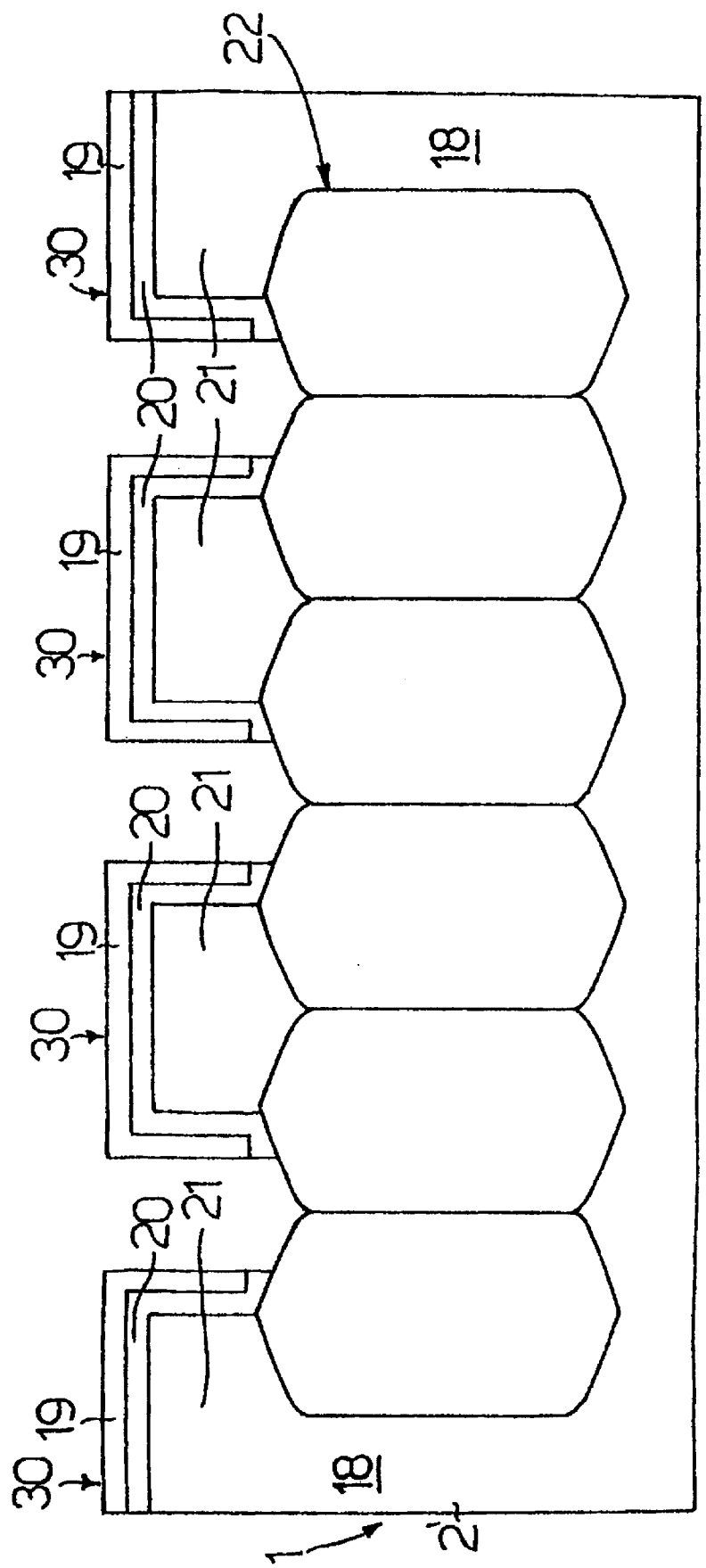
Figure 7:
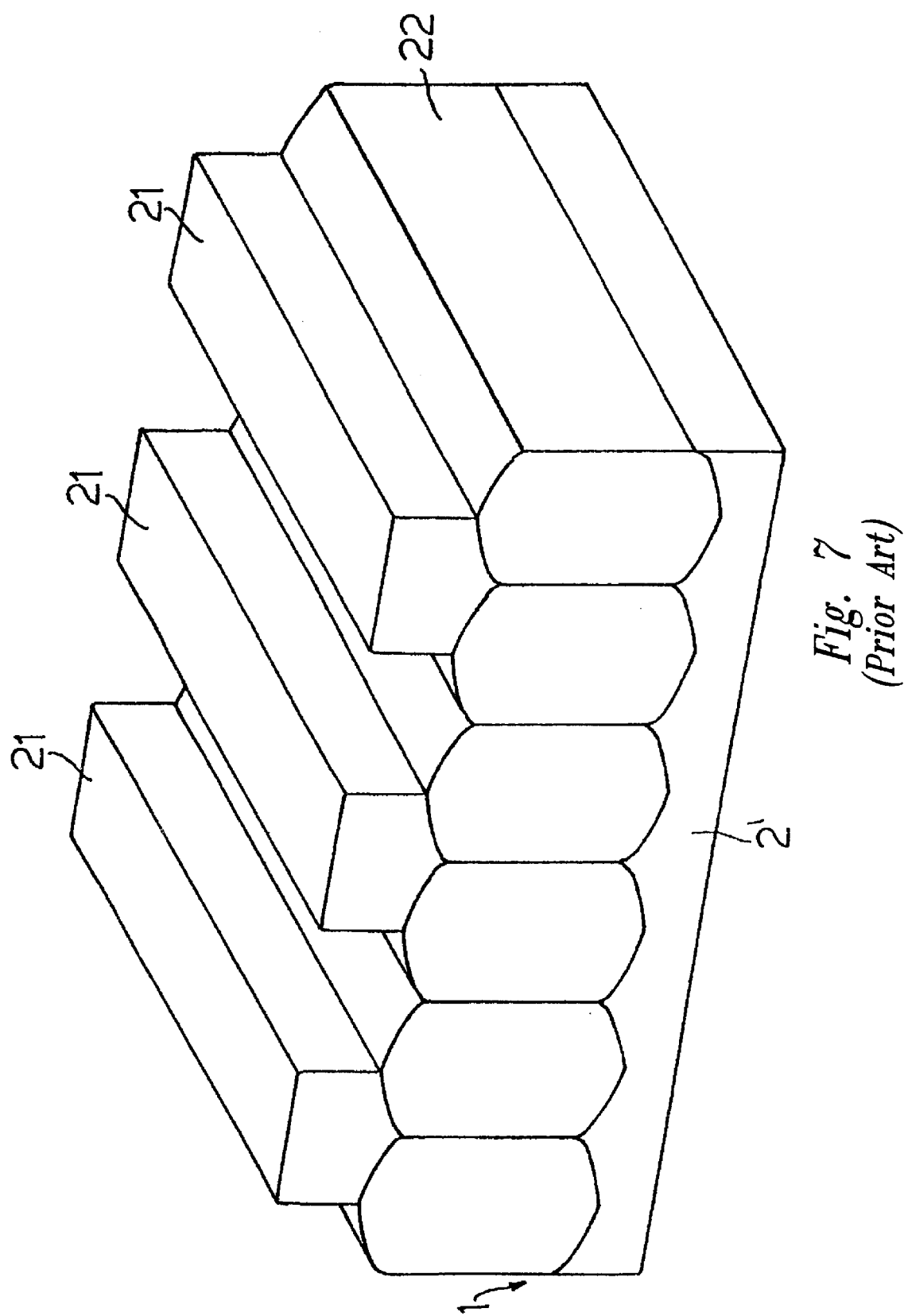
FIGS. 7 and 8 show perspective cross-sections in two subsequent steps of the prior manufacturing process.
Figure 8:
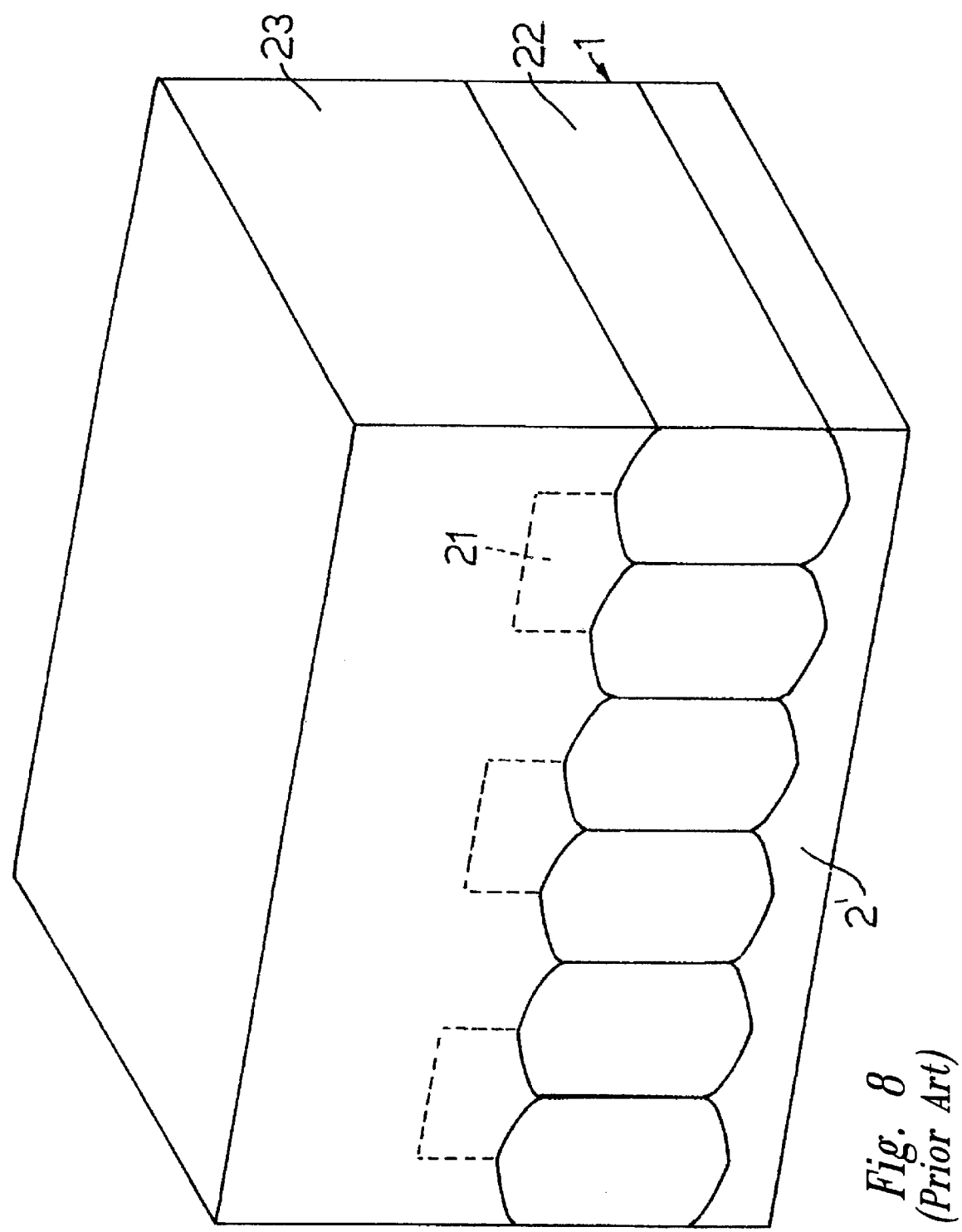
Figure 9:
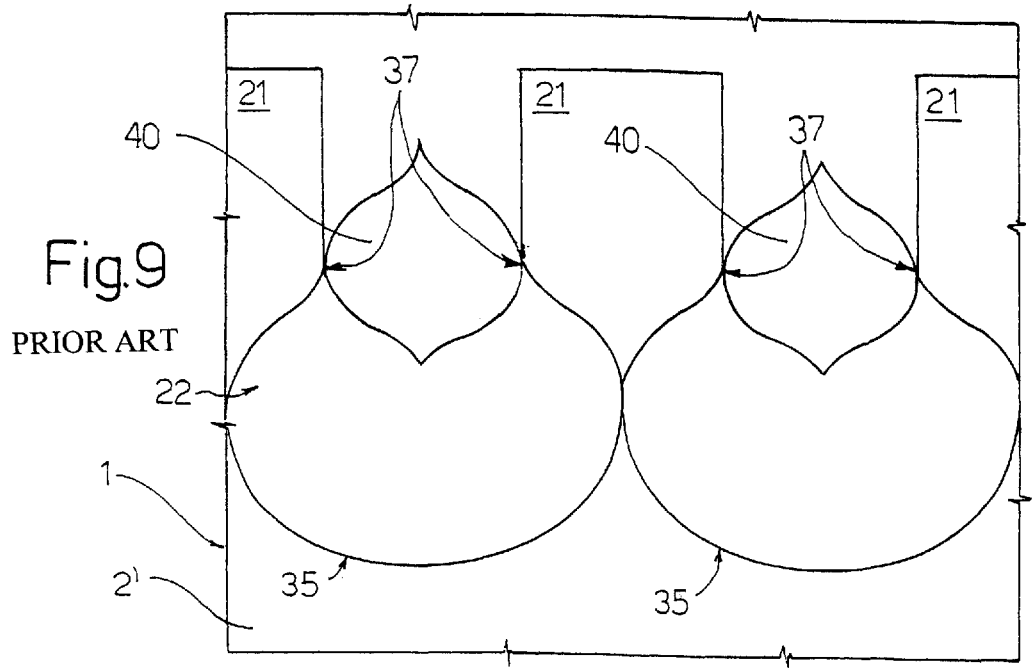
FIG. 9 shows a detail of FIG. 6, in enlarged scale.

The advantages of the described process are the following: the present process makes it possible to obtain a SOI wafer wherein the epitaxial monocrystalline silicon layer is completely passivated by the continuous buried oxide region 127, because the void area between the oxide and the epitaxial monocrystalline silicon (designated by 40 in FIG. 9) is no longer present, thereby reducing the risk of recombination between charge carriers in this area. The described process does not require additional masks as compared to the processes comprising trench insulation, since the second hard mask 142 required for forming the second trenches 144 can be obtained simply by modifying the trench mask already envisaged in the known processes.

Figure 23:
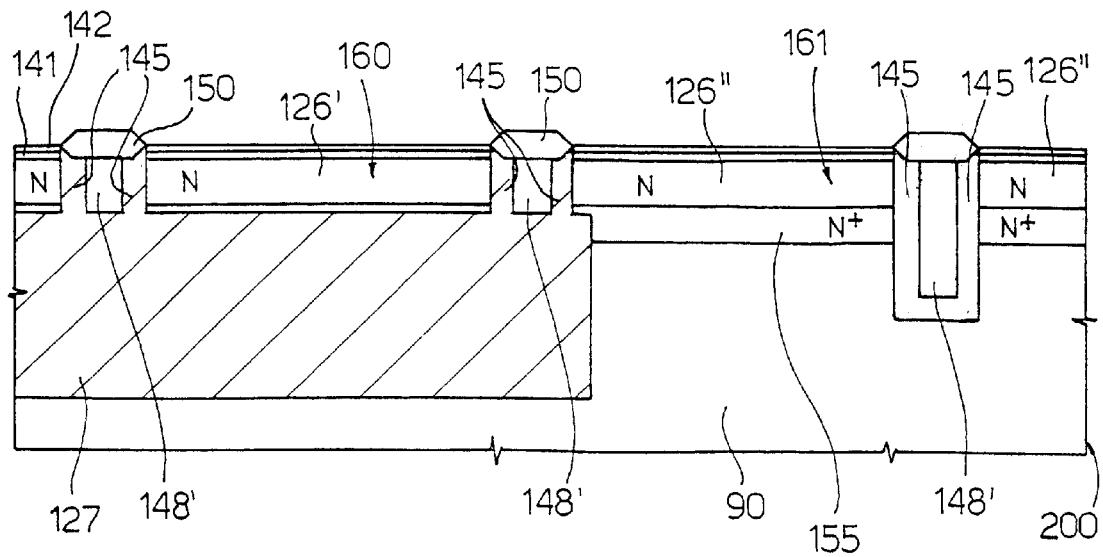
FIG. 23 shows a cross-section similar to that of FIG. 22, in reduced scale.

Furthermore, the cavities 121 may extend over the entire wafer area, and in this case also the continuous buried oxide region 127 extends along the entire wafer. Alternatively, the cavities 121 may occupy only partially the wafer area, so as to obtain, in the wafer, signal areas, wherein a completely isolated epitaxial silicon region is designed to house signal processing electronic devices and oxide-free power areas (with high thermal conductivity) designed to house power devices in which the epitaxial layer is directly and electrically connected to the substrate 90. For example, it is possible to manufacture wafers like the one shown in FIG. 23, wherein a signal area 160, insulated by the continuous oxide region 127 and the insulating region 151, and a power area 161 are shown. FIG. 23 also shows an N+-type buried layer 155, obtained by an antimony implant in the starting substrate 90, before the cavities 121 are formed. After the growth of the epitaxial layer 126, the doping agents spread also in the latter layer.

Finally, it is evident that numerous modifications and variations may be made to the process and device described and illustrated herein, all falling within the scope of the invention, as defined in the attached claims.

What is claimed is:

1. A process for manufacturing an SOI wafer, comprising:
   forming cavities in a substrate of semiconductor material;
   growing an epitaxial layer of monocrystalline type on top of said substrate and said cavities to obtain a wafer of monocrystalline semiconductor material embedding said cavities, said cavities being completely surrounded by said monocrystalline material;
   forming second trenches extending in said epitaxial layer up to said cavities; and
   oxidizing said cavities to form at least one continuous region of buried oxide.

2. The process of claim 1 wherein forming cavities comprises:
   forming first trenches in said substrate; said first trenches extending between portions of said wafer; and
   etching said substrate to remove said semiconductor material around said first trenches.

3. The process of claim 2 wherein said etching is carried out in TMAH.

4. The process of claim 3 wherein said etching is time-controlled.

5. The process of claim 2 wherein forming first trenches comprises:
   forming a first hard mask of insulating material; and
   anisotropically etching said substrate, using said first hard mask.

6. The process of claim 1, further comprising, after forming said cavities, coating walls of said cavities with a layer inhibiting epitaxial growth.

7. The process of claim 1 wherein forming second trenches comprises forming a hard mask and etching said epitaxial layer.

8. The process of claim 1 further comprising:
   filling said second trenches with filling regions of semiconductor material; and
   oxidizing upper portions of said filling regions so as to form regions of monocrystalline epitaxial silicon that are insulated at the sides and at the bottom.

9. The process of claim 8 wherein filling said second trenches comprises:
   depositing a semiconductor material layer over the entire surface of the wafer; and
   removing said semiconductor material layer on said surface of said wafer.

10. The process of claim 1 wherein said cavities extend along the entire area of said wafer.

11. The process of claim 1 wherein said cavities extend only on a part of the area of said wafer.

12. The process of claim 1, further comprising, before forming first trenches, doping said substrate of semiconductor material.

13. A process for manufacturing an SOI wafer, comprising:
   forming first trenches in a substrate of semiconductor material;

etching the first trenches to form cavities in the substrate of semiconductor material;

growing an epitaxial layer of monocrystalline silicon on top of the substrate of semiconductor material to cover the trenches and the cavities formed therein;

forming second trenches in the epitaxial layer to extend as far as the cavities; and oxidizing the cavities to form at least one continuous region of buried oxide.

14. The process of claim 13 wherein etching the first trenches further comprises coating the cavity walls with a layer inhibiting epitaxial growth.

15. The process of claim 14 wherein forming the second trenches comprises subsequently removing the epitaxial growth inhibiting layer from the cavities.

16. The process of claim 15 wherein forming the second trenches further comprises, subsequent to removing the epitaxial growth inhibiting layer, filling the second trenches with filling regions of semiconductor material; and oxidizing upper portions of the filling regions to form regions of monocrystalline epitaxial silicon that are insulated at the sides and at the bottom.

17. The process of claim 16 wherein filling the second trenches comprises depositing a semiconductor material layer over the entire surface of the wafer, and removing the semiconductor material layer on the surface of the wafer.

18. The process of claim 13, further comprising, prior to forming the first trenches, doping the substrate of semiconductor material.

19. A process for the manufacture of an SOI wafer by oxidation of buried channels, the process comprising:

forming first trenches in a wafer of monocrystalline silicon, the first trenches extending between portions of the wafer;

etching the wafer to remove the silicon around the first trenches and forming cavities in the wafer;

covering the walls of the cavities with an epitaxial growth inhibiting layer;

growing a monocrystalline epitaxial layer on top of the substrate and the cavities so as to obtain a monocrystalline wafer embedding buried cavities that are completely surrounded by silicon;

forming second trenches extending in the epitaxial layer as far as and in communication with the cavities;

removing the epitaxial growth inhibiting layer; and oxidizing the cavities to form at least one continuous region of buried oxide.

20. The process of claim 19, further comprising depositing a polysilicon layer on the entire surface of the wafer and inside the second trenches, removing the polysilicon layer on the surface and leaving filling regions inside the second trenches; and oxidizing on the top of the wafer the portions of the filling regions to form field oxide regions.

21. The process of claim 20 wherein forming the first trenches comprises forming a first hard mask of insulating material, and anisotropically etching the substrate using the first hard mask.

22. The process of claim 20 wherein forming the second trenches comprises forming a second hard mask, and etching the epitaxial layer using the second hard mask.

23. A process for manufacturing an SOI wafer, comprising in sequence, the steps of:

forming cavities in a substrate of semiconductor material;

growing an epitaxial layer of monocrystalline type on top of said substrate and said cavities to obtain a wafer of monocrystalline semiconductor material embedding said cavities, said cavities being completely surrounded by said monocrystalline material;

forming second trenches extending in said epitaxial layer up to said cavities; and oxidizing said cavities to form at least one continuous region of buried oxide.

* * * * *